US009120704B2

(12) United States Patent
Tsutsumi et al.

(10) Patent No.: US 9,120,704 B2

(45) Date of Patent: Sep. 1, 2015

(54) DIELECTRIC LAYER FOR ELECTROSTATIC CHUCK AND ELECTROSTATIC CHUCK

(71) Applicants: Nippon Tungsten Co., Ltd., Fukuoka (JP); Shinko Electric Industries Co., Ltd., Nagano (JP); Trek Holding Co., Ltd., Tokyo (JP); Japan Fine Ceramics Center, Aichi (JP)

(72) Inventors: Kouta Tsutsumi, Fukuoka (JP); Mitsuyoshi Nagano, Fukuoka (JP); Koki Tamagawa, Nagano (JP); Norio Shiraiwa, Nagano (JP); Tadayoshi Yoshikawa, Nagano (JP); Miki Saito, Nagano (JP); Toshio Uehara, Tokyo (JP); Hideaki Matsubara, Aichi (JP); Tetsushi Matsuda, Aichi (JP)

(73) Assignees: Nippon Tungsten Co., Ltd., Fukuoka (JP); Shinko Electric Industries Co., Ltd., Nagano (JP); Trek Holding Co., Ltd., Tokyo (JP); Japan Fine Ceramics Center, Aichi (JP)

( * ) Notice: Subject to any disclaimer, the term of this patent is extended or adjusted under 35 U.S.C. 154(b) by 4 days.

(21) Appl. No.: 14/054,417

(22) Filed: Oct. 15, 2013

(65) Prior Publication Data

US 2014/0103612 A1 Apr. 17, 2014

(30) Foreign Application Priority Data

Oct. 15, 2012 (JP) ................................ 2012-228239

(51) Int. Cl.

| | |
|---|---|
| ***H01L 21/68*** | (2006.01) |
| ***C04B 35/10*** | (2006.01) |
| ***H01L 21/683*** | (2006.01) |
| ***C04B 35/117*** | (2006.01) |
| ***C04B 35/645*** | (2006.01) |

(52) U.S. Cl.

CPC ............... *C04B 35/10* (2013.01); *C04B 35/117* (2013.01); *C04B 35/645* (2013.01); *H01L 21/6831* (2013.01); *H01L 21/6833* (2013.01); *C04B 2235/3232* (2013.01); *C04B 2235/3843* (2013.01); *C04B 2235/3856* (2013.01); *C04B 2235/3886* (2013.01); *C04B 2235/5445* (2013.01); *C04B 2235/77* (2013.01); *C04B 2235/786* (2013.01); *C04B 2235/96* (2013.01); *Y10T 279/23* (2015.01)

(58) Field of Classification Search

USPC ......... 501/96.1, 127; 428/325, 697, 699, 701, 428/702; 361/234

See application file for complete search history.

(56) References Cited

U.S. PATENT DOCUMENTS 5,275,981 A * 1/1994 Nishiyama et al. ........... 501/127
5,382,469 A * 1/1995 Kubota et al. ............... 501/96.1

(Continued)

FOREIGN PATENT DOCUMENTS

JP 02-034557 * 2/1990
JP 2000-143349 A 5/2000

(Continued)

*Primary Examiner* — Archene Turner

(74) *Attorney, Agent, or Firm* — Fish Stewart Yamaguchi PLLC

(57) ABSTRACT

A dielectric layer for an electrostatic chuck is formed of a ceramic material having a first phase including aluminum oxide and a second phase including composite carbonitride (Ti, Me)(C, N) that contains titanium as fine grains. The Me represents a transition element and metals of Group 4 to Group 6 such as Mo and W. The ceramic material that includes the second phase by 0.05 vol % to 2.5 vol % has a volume resistivity value of about $10^8$ to $10^{13}$ (Ω·cm) necessary for a Johnsen-Rahbek type electrostatic chuck.

10 Claims, 1 Drawing Sheet

Mounting surface a 2 4 6 100 10 20 22 30 8

(56) References Cited

U.S. PATENT DOCUMENTS 6,660,665 B2 * 12/2003 Yanagida et al. ............. 361/234
6,986,865 B2 * 1/2006 Lin et al. ....................... 264/619

FOREIGN PATENT DOCUMENTS

JP 2006-049356 A 2/2006
JP 2008-087988 A 4/2008

* cited by examiner

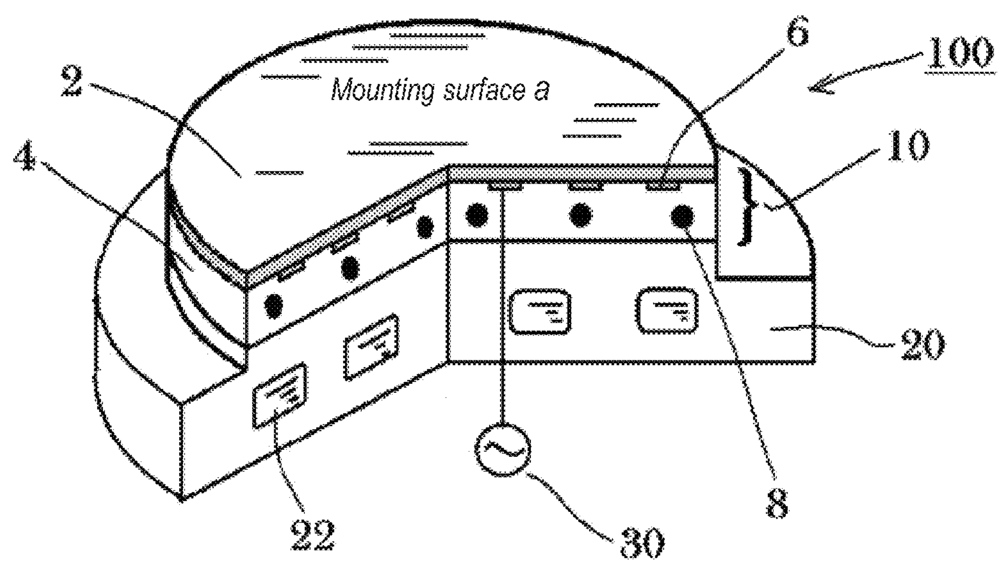
Mounting surface a
2
4
6
100
10
20
22
30
8

DIELECTRIC LAYER FOR ELECTROSTATIC CHUCK AND ELECTROSTATIC CHUCK

CROSS-REFERENCES TO RELATED APPLICATION

This application claims priority from Japanese Patent Application Serial No. 2012-228239 filed Oct. 15, 2012, the contents of which are incorporated herein by reference in their entirety.

FIELD OF THE INVENTION

The present invention relates to a dielectric layer for an electrostatic chuck and an electrostatic chuck having the dielectric layer.

BACKGROUND OF THE INVENTION

Background Art

Conventionally, in semiconductor manufacturing equipment, liquid crystal display manufacturing equipment, and the like, an electrostatic chuck is used to attract and support various substrates (hereinafter, simply referred to as "substrate") such as a wafer of Si or the like, a sapphire substrate, a glass substrate for FPD, and a TFT substrate. Electrostatic chucks are often formed of materials having aluminum oxide or aluminum nitride, which is excellent in heat resistance or corrosion resistance, as a main phase. Among these materials, the material of aluminum oxide is easily available and is easily produced.

An electrostatic chuck typically has a structure illustrated in FIG. 1. A member attracting and supporting a substrate is referred to as a "dielectric layer 2". The surface on which a substrate is supported with the dielectric layer 2 is a "mounting surface a". The rear surface of a mounting surface a is provided with "electrodes 6" for supplying current necessary for electrostatic attraction. A "base 4" for supporting the dielectric layer 2 with the electrodes 6 interposed therebetween, and the electrodes 6 are sealed with the dielectric layer 2 and the base 4. The dielectric layer 2, the electrodes 6, and the base 4 are generically referred to as an "electrostatic chuck 10". In some cases, a heater 8 may be embedded in the base 4. The dielectric layer 2 and the base 4 may be formed of the same material or different materials. It is preferable that both members be formed of the same material and have a unified structure.

The electrostatic chuck 10 is fixed onto a backing plate 20. The backing plate 20 is typically formed of a high thermal conducting metal obtained by performing alumite treatment on the surface of an aluminum alloy. The backing plate 20 is often controlled in temperature through the use of a cooling water channel 22 installed therein.

The electrostatic chuck 10 and the backing plate 20 are generically referred to as a "chuck unit 100".

A dielectric layer for an electrostatic chuck using static electricity, which is used in semiconductor manufacturing equipment or the like, can be roughly classified into a type (Coulomb type) using a Coulomb force and a type (Johnsen-Rahbek type) using a Johnsen-Rahbek force.

The Johnsen-Rahbek type has an advantage that it has a larger attraction force and attracts an object with a lower voltage in comparison with the Coulomb type. The Johnsen-Rahbek type has an advantage that the voltages at the time of attraction and escape are relatively low. On the other hand, there is a possibility that leak current to be described later may be generated.

The Johnsen-Rahbek type dielectric layer of an electrostatic chuck typically requires volume resistivity of about $10^8$ to $10^{13}$ (Ω·cm). When volume resistivity of a dielectric layer is lower than the above-mentioned volume resistivity, good attraction characteristics is not obtained, and current leaks to a substrate with a fall in withstanding voltage to destroy circuit elements formed on the substrate. The current flowing in the substrate is referred to as leak current.

The Johnsen-Rahbek type dielectric layer for an electrostatic chuck requires following characteristics in addition to the volume resistivity.

First, a characteristic that corrosion resistance to the atmosphere in semiconductor equipment is sufficient is required. Particularly, halogen plasma gas having a high corrosion property is used in a plasma etching process. Therefore, corrosion resistance to the plasma gas (hereinafter, simply referred to as "corrosion resistance") is required. When this corrosion resistance is low, reaction products produced from electrostatic chuck components and plasma gas are diffused in the equipment. The diffused products serve as grains and are attached to a substrate to have an adverse influence such as contamination or short-circuit.

In general, when a substrate is attracted and supported, pores on the surface of the electrostatic chuck and pores therein are not desirable. Pores have an adverse influence on the attraction and support of a substrate. Pores make grains be attached to the substrate and make cleaning the inside of the equipment difficult, because the pores hold the grains.

Then, with an increase in size of a substrate and a decrease in size of circuitry, there is a demand for high profile accuracy in an electrostatic chuck. The processing accuracy of a polycrystalline ceramic material greatly depends on the crystal grain size. Accordingly, the smaller the grain size of a material is, the sharper the edge angle is and thus higher-accuracy processing is possible.

When an electrostatic chuck is formed of a ceramic material having a relatively larger grain size, grain-escaped marks that may be formed at the time of contact with a wafer or processing a wafer become larger. Since the grain-escaped marks hold grains, similarly to the above-mentioned pores, substrate quality degrades.

The larger the crystal grain size becomes, the lower the mechanical characteristics become, particularly, bending strength. The lowering in mechanical characteristics generate grains due to destruction of members or grain escape.

That is, materials having a crystalline microstructure can be preferably used as the material used in an electrostatic chuck.

A lot of materials having aluminum oxide or nitride have been proposed as the material for an electrostatic chuck. Particularly, aluminum oxide is often used, but a single-phase material of aluminum oxide has very high volume resistivity of $10^{15}$ (Ω·cm) or more and thus cannot be used for a Johnsen-Rahbek type electrostatic chuck without any change.

For example, in a pure single-phase material of aluminum oxide of 99.5% or more, grain growth with pores included therein is marked and it is difficult to obtain a dense sintered compact using a typical sintering method. It is preferable that a material for an electrostatic chuck have a small grain size.

On the other hand, a Coulomb type electrostatic chuck can be used when a dielectric layer thereof has volume resistivity of $10^{13}$ Ω·cm or more, and the other required characteristics are the same as in the Johnsen-Rahbek type.

An example where one or more types of additives are added to materials having aluminum oxide or nitride and the resultant is used as a material of a Johnsen-Rahbek type electrostatic chuck is disclosed in Patent Documents 1 to 3.

Patent Document 1 discloses an electrostatic chuck of a material having aluminum nitride, which includes aluminum nitride as a major component and includes 10 mol % to 30 mol % of TiN and 5 mol % to 20 mol % of Ce in conversion into oxide. It is mentioned that conductive TiN is added to aluminum nitride as an insulator to lower volume resistivity, whereby a Johnsen-Rahbek type electrostatic chuck is obtained.

Since the electrostatic chuck disclosed in this patent document includes aluminum nitride as a major component, thermal conductivity thereof can be raised. However, since TiN has low resistance to corrosive plasma gas such as $CF_4$, it is preferable for maintenance of substrate quality that the content be as small as possible. However, in this patent document, since the material includes at least 10 mol % of (about 9 vol %) of TiN, the degradation in substrate quality due to Ti cannot be avoided.

Patent Document 2 discloses an electrostatic chuck having a composition of 99.4 wt % or more of aluminum oxide as a major component and 0.2 to 0.6 wt % of titanium oxide and having volume resistivity of $10^8$ (Ω·cm) to $10^{11}$ (Ω·cm) at a room temperature. This patent document states that by employing the aforementioned configuration, an electrostatic chuck with good responsiveness which has excellent attraction of an object and escape characteristics is obtained.

However, the addition of titanium oxide to aluminum oxide causes a large variation in volume resistivity depending on conditions such as a firing temperature or a firing atmosphere and it is thus difficult to accurately control the volume resistivity in a sintering method. Since a color tune varies due to variations in any of sintering conditions, it is not suitable for mass production. This is partially because composite oxide such as aluminum titanate is produced from aluminum oxide and titanium oxide. The addition of titanium oxide cannot satisfactorily suppress grain growth of aluminum oxide.

Patent Document 3 discloses ceramics in which one or more types of conductive ceramics out of TiC, TiN, WC, TaC, MoC, NbC, and VC are dispersed in insulator ceramics such as $Al_2O_3$, $ZrO_2$, $Si_3N_4$, and AlN, which has volume resistivity of $1\times10^{-2}$ (Ω·cm) or less and has conductive ceramic grains of 2 μm or less. However, a desired electrostatic chuck cannot be obtained in this range of volume resistivity.

[Patent Document 1] Japanese Patent Application Laid-Open No. 2000-143349

[Patent Document 2] Japanese Patent Application Laid-Open No. 2006-049356

[Patent Document 3] Japanese Patent Application Laid-Open No. 2008-087988

SUMMARY OF THE INVENTION

The invention is related to a dielectric layer for an electrostatic chuck including a ceramic material that includes an aluminum oxide as a major component. In a first phase of the aluminum oxide, a second phase is dispersed. The second phase includes composite carbonitride of Ti and an Me expressed by (Ti, Me)(C, N). The Me contains one or more of transition elements of Group 3 to Group 11 of the periodic table.

A volume ratio of the second phase may be in a range of 0.05 vol % to 2.5 vol %. An average grain size of the composite carbonitride may in a range of 10 nm to 300 nm. The Me may be one or more elements of Group 4 to Group 6 of the periodic table. The Me may be Mo or two or more of transition metals that includes Mo. The (Ti, Me)(C, N) may be $(Ti_{1-x}, Me_x)(C_{1-y}, N_y)$ wherein $0.02 \le x \le 0.3$ and $0.1 \le y \le 0.7$.

BRIEF DESCRIPTION OF THE DRAWING

FIG. 1 is a diagram illustrating a typical structure of an electrostatic chuck.

DESCRIPTION OF THE INVENTION

In order to cause an electrostatic chuck to exhibit a large attraction force, it is important that a dielectric layer thereof has appropriate volume resistivity. As described above, aluminum oxide has a relatively low cost and has high corrosion resistance. However, ceramics of a single phase of aluminum oxide do not have volume resistivity suitable for an electrostatic chuck using a Johnsen-Rahbek force. Accordingly, a second phase for giving slight conductivity ($10^8$ to $10^{13}$ Ω·cm) is necessary in addition to a first phase of aluminum oxide.

However, as described above, an electrostatic chuck requires a decrease in grains and contamination and mechanical strength of such an extent to cause grains to not easily escape, in addition to the attraction characteristic. For example, a rise in energy of an etching process and non-degradable cleaning are introduced for the purpose of a rise in throughput, and the electrostatic chuck is exposed to a plasma environment of halogen-based corrosive gas. On the other hand, the corrosion content in the dielectric layer for an electrostatic chuck according to the related art including a predetermined amount or more of the second phase which is poorer in corrosion resistance than aluminum oxide cannot be reduced.

If the corrosion resistance is the only problem, it is possible to suppress degradation in resistance to the corrosive plasma gas by reducing the content of the second phase. However, the volume resistivity cannot be satisfactorily lowered by the addition of a small amount of additives other than $TiO_2$. On the other hand, when $TiO_2$ is added, the volume resistivity can be satisfactorily lowered with a small amount, but grains of aluminum oxide grow large in size. Accordingly, when the grains escape, the dielectric layer is greatly damaged. As described above, this is not suitable for mass production.

In consideration of the above-mentioned circumstances, an object of the present invention is to provide a dielectric layer for an electrostatic chuck having the following characteristics:

(1) that the dielectric layer exhibits volume resistivity suitable for attraction using a Johnsen-Rahbek force;

(2) that the volume of additives added to aluminum oxide is sufficiently small and grains harmful to a substrate are less produced;

(3) that an amount of pores is small, that is, a relative density is sufficiently high;

(4) that the dielectric layer has microstructures, has high mechanical strength and high processing accuracy, and has a small grain-escaped size; and (5) that volume resistivity and color tone are not affected by any variation in sintering conditions and mass production is stably possible.

A dielectric layer for an electrostatic chuck according to the present invention is a ceramic having aluminum oxide ($Al_2O_3$) as a main phase. The dielectric layer is an insulator having volume resistivity of $10^{15}$ (Ω·cm) or more in a simple material of aluminum oxide.

As described above, a Johnsen-Rahbek type electrostatic chuck requires volume resistivity of about $10^8$ (Ω·cm) to $10^{13}$ (Ω·cm). Accordingly, an additive for lowering the volume resistivity is added to the main phase.

The additive is composite carbonitride of titanium and a transition element. The composite carbonitride is expressed by a chemical formula of (Ti, Me)(C, N). The composite carbonitride can be expressed by $(Ti_x, Me_{1-x})(C_yN_{1-y})$ in consideration of components thereof. Me in the chemical formula represents one or two or more types of transition elements in Group 3 to Group 11 of the periodic table other than Ti. Ti and Me are both essential, particularly, x has a value of 0.02 to 0.3 and y has a value of 0.1 to 0.7.

The composite carbonitride has an NaCl structure, and is not stably present as a single phase when x is greater than 0.3. When x is less than 0.02, powder is easily oxidized. When y is greater than 0.7, N easily escapes at the time of producing the powder and it is difficult to obtain powder having stable quality. When y is less than 0.1, the powder is easily oxidized, similarly to x.

Among the transition metals, more suitable element Me is transition elements in Group 4 to Group 6 of the periodic table and are specifically one or two or more types of Zr, Hf, V, Nb, Ta, Cr, Mo, and W.

It is preferable that the composite carbonitride is dispersed by 0.05 vol % to 2.5 vol % in a sintered compact. The composite carbonitride is conductive grains and is fine grains as described later. By forming carbonitride in fine grains and dispersing the carbonitride by 0.05 vol % or more in the sintered compact, the resistivity of the dielectric layer can be easily set to be in a range of $10^8$ to $10^{13}$ (Ω·cm). When the content of carbonitride is less than 0.05 vol %, the volume resistivity may not be lowered to the above-mentioned range. On the other hand, when the content of carbonitride is greater than 2.5 vol %, the volume resistivity may be excessively lowered.

The average grain size of the composite carbonitride is preferably in a range of 10 nm to 300 nm. The composite carbonitride as a starting material can be produced to be very fine in the range of 10 nm to 300 nm by satisfying both of compounding of Ti and a transition element and forming carbonitride. On the other hand, it is difficult to atomize carbonitride of a simple material of a transition element, carbide of a composite transition element, and nitride of a composite transition element to this size using the presently-available techniques.

In composite carbonitride itself, grain growth at the sintering temperature is hardly caused. Accordingly, the grain size is equal to or slightly larger than the grain size of raw powder (for example, a raw material of 200 nm becomes 300 nm in a sintered compact). This is a feature of composite carbonitride. The grains of carbide, nitride, composite carbide, or composite nitride of the simple element make it difficult to reduce the grain size of a starting material as small as the composite carbonitride and relatively easily cause grain growth at the sintering temperature. Accordingly, when these materials are used, it is markedly difficult to have an average grain size of 300 nm or less after the sintering.

When the average grain size of the composite carbonitride is small, it contributes to maintenance of surface roughness of a mounting surface. When the grains of composite carbonitride which is poorer in corrosion resistance than aluminum oxide are 300 nm or less, the surface roughness of the mounting surface after corrosion is suppressed to be small.

The composite carbonitride does not chemically react at the sintering temperature (1200° C. to 2000° C.) of aluminum oxide and is stable mutually. For example, a reaction phase, a variation in composition at the grain boundary, and the like are not recognized.

Since a conductive path can be easily formed at the crystal grain boundary of aluminum oxide with a relatively small amount by adding fine carbonitride with an average grain size of 300 nm or less, it is possible to reduce volume resistivity by addition of a smaller amount in comparison with the grains of carbide, nitride composite carbide, or composite nitride of the simple element.

As described above, since typical additives such as TiC has low resistance to corrosive gas plasma and causes grains and contamination to give a great trouble to a substrate, it is preferable that the content thereof be as small as possible. On the other hand, since aluminum oxide has satisfactorily high corrosion resistance as described above, aluminum oxide is a very suitable material from the viewpoint of contamination in the equipment. It is advantageous that carbonitride is suppressed to a smaller content than aluminum oxide to set desired volume resistivity.

The composite carbonitride expressed by (Ti, Me)(C, N) causes a good effect of suppressing grain growth of aluminum oxide. The composite carbonitride can be formed as very fine grains and exhibits the grain growth suppression effect even with a small amount of 0.05 vol %. Particularly, it is possible to markedly suppress grain growth with 0.5 vol % or more.

The effect of suppressing grain growth of composite carbonitride depends on the grain size of a starting material, and the average grain size of aluminum oxide can be typically set to 5 μm or less. Accordingly, it is possible to realize high mechanical strength and also to minimize production of grains even when grains escape in use. In addition, the surface roughness of the mounting surface is small.

A sintering agent or the like can be also added in addition to aluminum oxide and composite carbonitride. For example, MgO, $ZrO_2$, $Y_2O_3$, TiC, CaO, $Ce_2O_3$, $La_2O_3$, and $SiO_2$ may be added. The dielectric layer may be allowed to include other compounds in addition to aluminum oxide and composite carbonitride. The allowed amount is about 5 vol % or less with respect to aluminum oxide. That is, the volume ratio of aluminum oxide occupying the first phase (main phase) having aluminum oxide as a major component is typically more than 95 vol %.

In ceramics in which $TiO_2$ is added to aluminum oxide, variations in volume resistivity and color tone occur due to any variation in sintering conditions as described above. This is because the reduced state of $TiO_2$ varies depending on the sintering temperature or atmosphere and aluminum oxide and $TiO_2$ cause a chemical reaction or solid solution at the sintering temperature. Aluminum oxide and (Ti, Me) (C, N) forming the electrostatic chuck according to the present invention do not cause solid solution or reaction mutually. Accordingly, it is possible to produce the dielectric layer without any change in volume resistivity or color tone by controlling the composition ratio or the grain size of a starting material.

According to the present invention, it is possible to provide a dielectric layer for an electrostatic chuck having the characteristics of (1) to (5). In a Johnsen-Rahbek type electrostatic chuck, it is possible to atomize the structure and to enhance corrosion resistance to plasma gas and mechanical strength.

EMBODIMENTS

A dielectric layer for an electrostatic chuck according to the present invention can be typically produced and used in the following forms.

Aluminum oxide with an average grain size of 0.2 μm to 3 μm is used as a main phase in raw powder. Aluminum oxide may have high purity or may have a small amount of sintering agent such as MgO, $ZrO_2$, $TiO_2$, TiC, $Y_2O_3$, CaO, $Ce_2O_2$, $La_2O_3$, and $SiO_2$ added thereto.

Composite carbonitride is composite carbonitride of a transition element necessarily including Ti. When a transition element is expressed by Me, the composite carbonitride can be expressed by a chemical formula of (Ti, Me) (C, N). A starting material of composite carbonitride used for the raw powder of the electrostatic chuck has an average grain size of 10 nm to 200 nm. The composite carbonitride may be obtained using a reduction method, a gas phase method, or a liquid phase method or may be obtained using a grinding method. As described above, transition elements (from which Ti is excluded) of Group 4 to Group 6 of the periodic table are preferably used as Me and one or both of W and Mo can be more preferably used.

The mixing ratio of both is estimated so that the main phase of aluminum oxide ranges from 97.5 vol % to 99.95 vol % and a composite carbonitride phase ranges from 0.05 vol % to 2.5 vol %. For example, when an additive other than the composite carbonitride, such as a sintering agent of $Al_2O_3$, is added, the additive is treated to be included in the main phase. This is because the volume fraction of composite carbonitride is important.

After the weighing of the powder, the powder is mixed at the above-mentioned ratio and is pulverized in some cases. A ball mill, an attritor, a mixer, and a beads mill can be representatively used in this process, but the method is not limited as long as the powder can be satisfactorily mixed. A wet method or a dry method may be used. When the wet method is used, the resultant is additionally dried later to obtain mixed powder.

The mixed powder is input to a hot-pressing mold in a state where the mixed powder is maintained as powder or in a state where the mixed powder is mechanically pressed once into a green compact.

The hot pressing can be performed using a known method. The specific temperature and pressure ranges from 1100° C. to 2000° C. and from 5 MPa to 30 MPa, respectively. The maintenance time suitably ranges from about 10 minutes to 2 hours.

The hot-pressed body after being cooled is taken out, and the surface shape thereof is arranged through the use of mechanical processing and is processed into a final shape.

The sintering using hot pressing has been described above, but when mold pressing or molding before being sintered is performed, a molding binder may be added thereto after mixing the powder. The molding binder may employ a known organic binder such as paraffin, PVA (Polyvinyl Alcohol), and PEG (PolyEthylene Glycol). The organic binder is vaporized and evaporated in a range of 200° C. to 600° C. by heating the organic binder before being sintered. This degreased body may be sintered in a vacuum or in the atmosphere of reducing gas.

EXAMPLES

In these examples, conditions and physical properties for obtaining the dielectric layer for an electrostatic chuck according to the present invention under various conditions will be described.

Commercially-available powder with an average grain size of 0.5 μm and purity of 99.9% was used as aluminum oxide constituting the main phase.

Raw powder with an average grain size of 1 μm to 2 μm and purity of 99% or more was used as $TiO_2$ and TiC which are sintering agent and the like arbitrarily included in the main phase.

Powder with an average grain size of 100 nm and purity of 99.5% or more was used as the composite carbonitride powder. The composition thereof is expressed by (Ti, Me) (C, N).

Raw powder with an average grain size of 0.5 μm (500 nm) was used as starting materials of oxide, carbide, nitride, composite carbide, and composite nitride other than described above. These are larger in grain size than the composite carbonitride powder but powder finer than this grain size is hardly available.

The starting materials were mixed in the blending compositions shown in Table 1.

Hereinafter, from the mixture to the evaluation will be described using No. 3 sample in Table 1.

In the compositions shown in Table 1, the aluminum oxide powder and the composite carbonitride powder were weighed so as to be 99.5:0.5 in conversion of volume fraction after being sintered, methanol and alumina balls are added thereto, and the resultant was pulverized and mixed with a ball mill for 20 hours to obtain slurry. Powder of $(Ti_{0.8}Mo_{0.2})(C_{0.6}N_{0.4})$ was used as the composite carbonitride powder.

The slurry was dried with a spray dryer and was granulated to obtain mixed powder.

The mixed powder was subjected to hot pressing with a pressure of 15 MPa in a flow of nitrogen gas in a hot-pressing furnace. Sintering was first performed at the sintering temperature of 1400° C. and suitable conditions were found out in such a method of raising the temperature by 50° C. when the relative density of 99% or more could not be obtained. Since the relative density exceeded 99% at 1650° C., this temperature was set as the sintering temperature (the sintering temperatures of other samples were set in the same way). When the relative density did not reach 99% even by raising the temperature of No. 3 sample and a comparative sample, the highest relative density out of the obtained densities was described.

The resultant sintered compact was mechanically processed in the shapes of a volume resistivity measurement test sample (ϕ20×1.5 mm) and a transverse rupture strength test sample (3×4×40 mm) by the use of a grinding machine, and the average crystal grain size, the volume resistivity, and the mechanical properties of aluminum oxide were measured. The volume resistivity was measured using the method described in JIS C 2151. The volume resistivity was measured at 100° C. close to the actual use environment of an electrostatic chuck.

Using the above-mentioned method, the same test was performed on samples having different compositions shown in Table 1. The measurement results are shown in Table 1.

TABLE 1

| Sample No. | Composition (vol %) with balance of $Al_2O_3$ | Volume resistivity (100° C.) (Ω · cm) | Relative density (%) | Average grain size of $Al_2O_3$ (μm) |
|---|---|---|---|---|
| 1 | 0.05% (Ti,Mo)(C,N) | $3.7 \times 10^{11}$ | 98.0 | 9.4 |
| 2 | 0.1% (Ti,Mo)(C,N) | $2.5 \times 10^{11}$ | 98.6 | 10.2 |
| 3 | 0.5% (Ti,Mo)(C,N) | $1.0 \times 10^{11}$ | 99.8 | 3.3 |
| 4 | 1% (Ti,Mo)(C,N) | $6.9 \times 10^{9}$ | 99.9 | 2.6 |
| 5 | 1.5% (Ti,Mo)(C,N) | $2.9 \times 10^{9}$ | 99.8 | 2.2 |
| 6 | 2% (Ti,Mo)(C,N) | $4.5 \times 10^{8}$ | 99.3 | 2.2 |
| 7 | 2.5% (Ti,Mo)(C,N) | $1.2 \times 10^{8}$ | 98.9 | 1.9 |
| 8 | 0.5% (Ti,Mo)(C,N)—0.5% $TiO_2$ | $2.6 \times 10^{10}$ | 98.1 | 7.8 |
| 9 | 0.5% (Ti,Mo)(C,N)—0.5% TiC | $3.8 \times 10^{10}$ | 99.5 | 3.4 |
| 10 | 1.5% (Ti,W)(C,N) | $3.0 \times 10^{9}$ | 99.1 | 2.8 |
| *11 | 5% (Ti,Mo)(C,N) | Less than $10^{8}$ | 98.2 | 1.2 |
| *12 | 0.5% $TiO_2$ | $2.2 \times 10^{12}$ | 97.3 | 27.5 |
| *13 | 2% $TiO_2$ | Less than $10^{8}$ | 98.9 | 10.3 |
| *14 | 0.5% TiC | More than $10^{13}$ | 98.6 | 10.9 |
| *15 | 2% TiC | $2.4 \times 10^{9}$ | 99.4 | 4.2 |
| *16 | 2% TiN | $3.6 \times 10^{10}$ | 99.3 | 4.6 |
| *17 | 2% ZrN | More than $10^{13}$ | 99.6 | 5.4 |
| *18 | 2% $ZrB_2$ | More than $10^{13}$ | 99.4 | 4.9 |
| *19 | Simple material of $Al_2O_3$ | More than $10^{13}$ | 97.0 | 29.9 |

In Table 1, samples denoted by mark "*" are comparative samples departing from the scope of the present invention.

The following facts can be seen from the results of Table 1.

(Crystal Grain Size)

The structures of Sample Nos. 1 to 10 which are samples within the scope of the present invention were observed using a SEM (Scanning Electron Microscope). It was confirmed that the average crystal grain sizes of aluminum oxide in Sample Nos. 1 to 10 of the present invention were smaller than those in *Comparative Sample Nos. 11 to 19. That is, by adding fine composite carbonitride (Ti, Me) (C, N) (where Me is Mo or W) having a higher grain growth suppression effect in comparison with other additives, the crystal grain size of aluminum oxide could be satisfactorily reduced. This is clear from comparison of Sample No. 3 to which an additive of the second phase was added by as much with *Comparative Sample Nos. 12 and 14 and comparison of Sample No. 6 with *Comparative Sample Nos. 13, 15, 16, 17, and 18. Sample No. 10 is an example where $(Ti_{0.85}, W_{0.15})(C_{0.7}, N_{0.3})$ was used as the composite carbonitride. It could be seen that the operation of reducing the crystal grain size of aluminum oxide was slightly lower than that of a sample using (Ti, Mo)(C, N) but was high even when a transition element other than Mo was used as Me.

The average grain sizes of the aluminum oxide phase in Sample Nos. 1 to 10 were in a range of 1.9 μm to 10.2 μm. Particularly, the average grain sizes in Sample Nos. 3 to 7 and 10 were very small and were in a range of 1.9 μm to 3.3 μm. On the other hand, the average grain sizes of *Comparative Sample Nos. 12 and 13 including aluminum oxide and $TiO_2$ by 0.5 vol % to 2 vol % were 10.3 μm and 27.5 μm, respectively. In general, escape of ceramic grains occurs in the unit of crystal grains with destruction of the grain boundaries. Accordingly, even when grains escape in the dielectric layer for an electrostatic chuck according to the present invention, the grain-escaped size and amount are very small in comparison with a dielectric layer for an electrostatic chuck based on the aluminum oxide-$TiO_2$ system according to the conventional art.

(Volume Resistivity)

Sample Nos. 3 to 6 within the scope of the present invention and *Comparative Sample Nos. 12 to 18 have the same volume fraction of the second phase. In comparing the volume resistivity of Sample No. 3 with *Comparative Sample Nos. 12 and 14 and comparing the volume resistivity of Sample No. 6 with *Comparative Sample Nos. 13, 15, 16, 17, and 18, the ceramics of the present invention exhibited a lower value. That is, by using fine composite carbonitride (Ti, Mo)(C, N) in which grains hardly grow during sintering, the volume resistivity could be lowered with the smaller volume fraction of the second phase. It could be seen that the amount of additive necessary to realize equivalent volume resistivity was smaller than those of other additives. The ceramics of the present invention are small in average grain size as described above, and when the compositions are equal, the smaller the grain size of a structure becomes, the higher the strength or hardness becomes and thus it is difficult to destroy the structure, which is an advantage of the present invention.

Sample Nos. 1 to 10 in which the amount of the composite carbonitride (Ti, Me)(C, N) (where Me is Mo or W) phase ranges from 0.05 vol % to 2.5 vol % exhibit volume resistivity in a range of $10^8$ to $10^{13}$ (Ω·cm), which are suitable for a Johnsen-Rahbek type electrostatic chuck.

(Other Characteristics)

Three-point bending strength and Vickers hardness were measured. The bending strength was measured using a three-point bending method (JIS R 1601). The Vickers hardness was tested with a welding pressure of 1 Kgf. The volume resistivity was measured at a room temperature using a method described in JIS C 2151.

Sample Nos. 1 to 10 constituting the dielectric layer for an electrostatic chuck according to the present invention had three-point bending transverse rupture strength in a range of 400 MPa (Sample No. 1) to 712 MPa (Sample No. 7) and Vickers Hardness in a range of 1517 Hv (Sample No. 1) to 2014 Hv (Sample No. 5), which were characteristics causing no problem in use as the dielectric layer for an electrostatic chuck.

The preceding description has been presented only to illustrate and describe exemplary embodiments of the present dielectric layer for electrostatic chuck and electrostatic chuck. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A dielectric layer for an electrostatic chuck comprising:

a ceramic material that includes an aluminum oxide, wherein in a first phase of the aluminum oxide, a second phase is dispersed;

the second phase comprises composite carbonitride of Ti and an Me expressed by (Ti, Me)(C, N); wherein the Me comprises one or more of transition elements of Group 3 to Group 11 of the periodic table;

a volume ratio of the second phase being in a range of 0.05% to 2.5% by volume.

2. The dielectric layer according to claim 1, wherein an average grain size of the composite carbonitride is in a range of 10 nm to 300 nm.

3. The dielectric layer according to claim 1, wherein the Me is one or more elements of Group 4 to Group 6 of the periodic table.

4. The dielectric layer according to claim 1, wherein the Me is Mo or at least two types of transition metals that includes Mo.

5. The dielectric layer according to claim 1, wherein the (Ti, Me)(C, N) is $(Ti_{1-x}Me_x)(C_{1-y}N_y)$ where $0.02 \leq x \leq 0.3$ and $0.1 \leq y \leq 0.7$.

6. An electrostatic chuck comprising the dielectric layer according to claim 1.

7. An electrostatic chuck comprising the dielectric layer according to claim 2.

8. An electrostatic chuck comprising the dielectric layer according to claim 3.

9. An electrostatic chuck comprising the dielectric layer according to claim 4.

10. An electrostatic chuck comprising the dielectric layer according to claim 5.

* * * * *